United States Patent
Zhong et al.

(10) Patent No.: US 12,099,308 B2
(45) Date of Patent: Sep. 24, 2024

(54) METHODS AND APPARATUS FOR CORRECTING LITHOGRAPHY SYSTEMS

(71) Applicant: Applied Materials, Inc., Santa Clara, CA (US)

(72) Inventors: Qin Zhong, Santa Clara, CA (US); Hwan Joo Jeong, Los Altos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 166 days.

(21) Appl. No.: 17/914,840

(22) PCT Filed: Apr. 20, 2020

(86) PCT No.: PCT/US2020/028911
§ 371 (c)(1),
(2) Date: Sep. 27, 2022

(87) PCT Pub. No.: WO2021/216032
PCT Pub. Date: Oct. 28, 2021

(65) Prior Publication Data
US 2023/0144586 A1      May 11, 2023

(51) Int. Cl.
*G06T 1/00*      (2006.01)
*G03F 7/00*      (2006.01)
*G06T 7/174*    (2017.01)

(52) U.S. Cl.
CPC ........ *G03F 7/70516* (2013.01); *G06T 1/0007* (2013.01); *G06T 7/174* (2017.01);
(Continued)

(58) Field of Classification Search
CPC ............. G03F 7/70516; G03F 7/70275; G03F 7/70258; G06T 1/0007; G06T 7/174; G06T 2207/10052; G06T 2207/20016
See application file for complete search history.

(56) References Cited

U.S. PATENT DOCUMENTS

| 6,801,358 B2 * | 10/2004 | Shafer | G03F 1/84 |
| | | | 359/360 |
| 7,724,362 B1 * | 5/2010 | Rosengaus | G01N 21/956 |
| | | | 356/237.4 |

(Continued)

OTHER PUBLICATIONS

International Search Report and Written Opinion, PCT/US2020/028911, Oct. 28, 2021.

*Primary Examiner* — Hung V Nguyen
*Assistant Examiner* — Hung Henry Nguyen
(74) *Attorney, Agent, or Firm* — Patterson + Sheridan, LLP (57) ABSTRACT

Aspects of the present disclosure relate to methods and apparatus for correcting lithography systems. In one implementation, a method of operating a lithography system includes directing first light beams toward a reflective surface of a first substrate using an optical module. The method includes directing the first light beams collected through at least an objective lens toward a camera, and taking a plurality of first images of the first light beams. The method includes directing second light beams at an oblique angle toward a patterned surface of a second substrate using an illumination source disposed below the objective lens. The method includes directing the second light beams collected through at least an objective lens toward a camera, and taking a plurality of second images of the second light beams. The method includes determining a tip correction, a tilt correction, and an optimal vertical position for the optical module.

20 Claims, 7 Drawing Sheets

(52) U.S. Cl.
CPC ............... *G06T 2207/10052* (2013.01); *G06T 2207/20016* (2013.01)

(56) References Cited

U.S. PATENT DOCUMENTS

| | | | |
|---|---|---|---|
| 8,072,591 B2 * | 12/2011 | Markwort | G01N 21/9501 382/145 |
| 10,503,076 B1 * | 12/2019 | Johnson | G03F 7/2008 |
| 2011/0157569 A1 | 6/2011 | Baek et al. | |
| 2012/0026478 A1 | 2/2012 | Chen et al. | |
| 2012/0206703 A1 | 8/2012 | Bhattacharyya et al. | |
| 2016/0085156 A1 | 3/2016 | Markle | |
| 2020/0073253 A1 | 3/2020 | Johnson et al. | |

* cited by examiner

METHODS AND APPARATUS FOR CORRECTING LITHOGRAPHY SYSTEMS

BACKGROUND

Field

Aspects of the present disclosure relate to methods and apparatus for correcting lithography systems. In one example, a tilt correction, a tip correction, and a vertical correction are determined for an optical module of a lithography system.

Description of the Related Art

Operational issues can arise when an image plane projected by a lithography system is not parallel to a substrate and/or is not in focus. For example, a non-parallel and/or an out-of-focus image plane can cause incorrect patterning and/or mura on the substrate. Defects in the lithography system can also cause incorrect patterning and/or mura on the substrate.

Additionally, it can be difficult, time-consuming, and resource-consuming to cause the image plane to be in focus and/or to be parallel to the substrate.

Therefore, there is a need for methods and apparatus that facilitate placing image planes projected by lithography systems to be parallel to substrates and to be in focus.

SUMMARY

Aspects of the present disclosure relate to methods and apparatus for correcting lithography systems. In one example, a tilt correction, a tip correction, and a vertical correction are determined for an optical module of a lithography system.

In one implementation, a method of operating a lithography system includes directing first light beams toward a reflective surface of a first substrate using a spatial light modulator of an optical module. The method includes collecting the first light beams that reflect off of the reflective surface through at least an objective lens of the optical module. The method includes directing the first light beams collected through at least the objective lens toward a camera of the optical module using a beam splitter of the optical module. The method includes taking a plurality of first images, using the camera, of the first light beams directed toward the camera. The method includes directing second light beams at an oblique angle toward a patterned surface of a second substrate using an illumination source disposed below the objective lens. The method includes collecting the second light beams that scatter off of the patterned surface through at least the objective lens, and directing the second light beams collected through at least the objective lens toward the camera using the beam splitter. The method includes taking a plurality of second images, using the camera, of the second light beams directed toward the camera. The method includes determining a tip correction, a tilt correction, and an optimal vertical position for the optical module.

In one implementation, a non-transitory computer-readable medium includes instructions that, when executed, cause a lithography system to direct first light beams toward a reflective surface of a first substrate using a spatial light modulator of an optical module. The instructions also cause the lithography system to collect the first light beams that reflect off of the reflective surface through at least an objective lens of the optical module. The instructions also cause the lithography system to direct the first light beams collected through at least the objective lens toward a camera of the optical module using a beam splitter of the optical module. The instructions also cause the lithography system to take a plurality of first images, using the camera, of the first light beams directed toward the camera. The instructions also cause the lithography system to direct second light beams at an oblique angle toward a patterned surface of a second substrate using an illumination source disposed below the objective lens. The instructions also cause the lithography system to collect the second light beams that scatter off of the patterned surface through at least the objective lens. The instructions also cause the lithography system to direct the second light beams collected through at least the objective lens toward the camera using the beam splitter. The instructions also cause the lithography system to take a plurality of second images, using the camera, of the second light beams directed toward the camera. The instructions also cause the lithography system to determine a tip correction, a tilt correction, and an optimal vertical position for the optical module.

In one implementation, a non-transitory computer-readable medium includes instructions that, when executed, cause a lithography system to direct brightfield light beams toward a reflective surface of a first substrate using a spatial light modulator of an optical module. The instructions also cause the lithography system to take a plurality of brightfield images, using a camera of the optical module, of reflected brightfield light beams that reflect off of the reflective surface. The instructions also cause the lithography system to direct darkfield light beams toward a patterned surface of a second substrate. The instructions also cause the lithography system to take a plurality of darkfield images, using the camera, of scattered darkfield light beams that scatter off of the patterned surface. The instructions also cause the lithography system to determine a tip correction, a tilt correction, and an optimal vertical position for the optical module.

BRIEF DESCRIPTION OF THE DRAWINGS

So that the manner in which the above-recited features of the disclosure can be understood in detail, a more particular description of the disclosure, briefly summarized above, may be had by reference to implementations, some of which are illustrated in the appended drawings. It is to be noted, however, that the appended drawings illustrate only common implementations of this disclosure and are therefore not to be considered limiting of its scope, for the disclosure may admit to other equally effective implementations.

To facilitate understanding, identical reference numerals have been used, where possible, to designate identical elements that are common to the figures. It is contemplated that elements disclosed in one implementation may be beneficially utilized on other implementations without specific recitation.

DETAILED DESCRIPTION

Aspects of the present disclosure relate to methods and apparatus for correcting lithography systems. In one example, a tilt correction, a tip correction, and a vertical correction are determined for an optical module of a lithography system.

Figure 1:
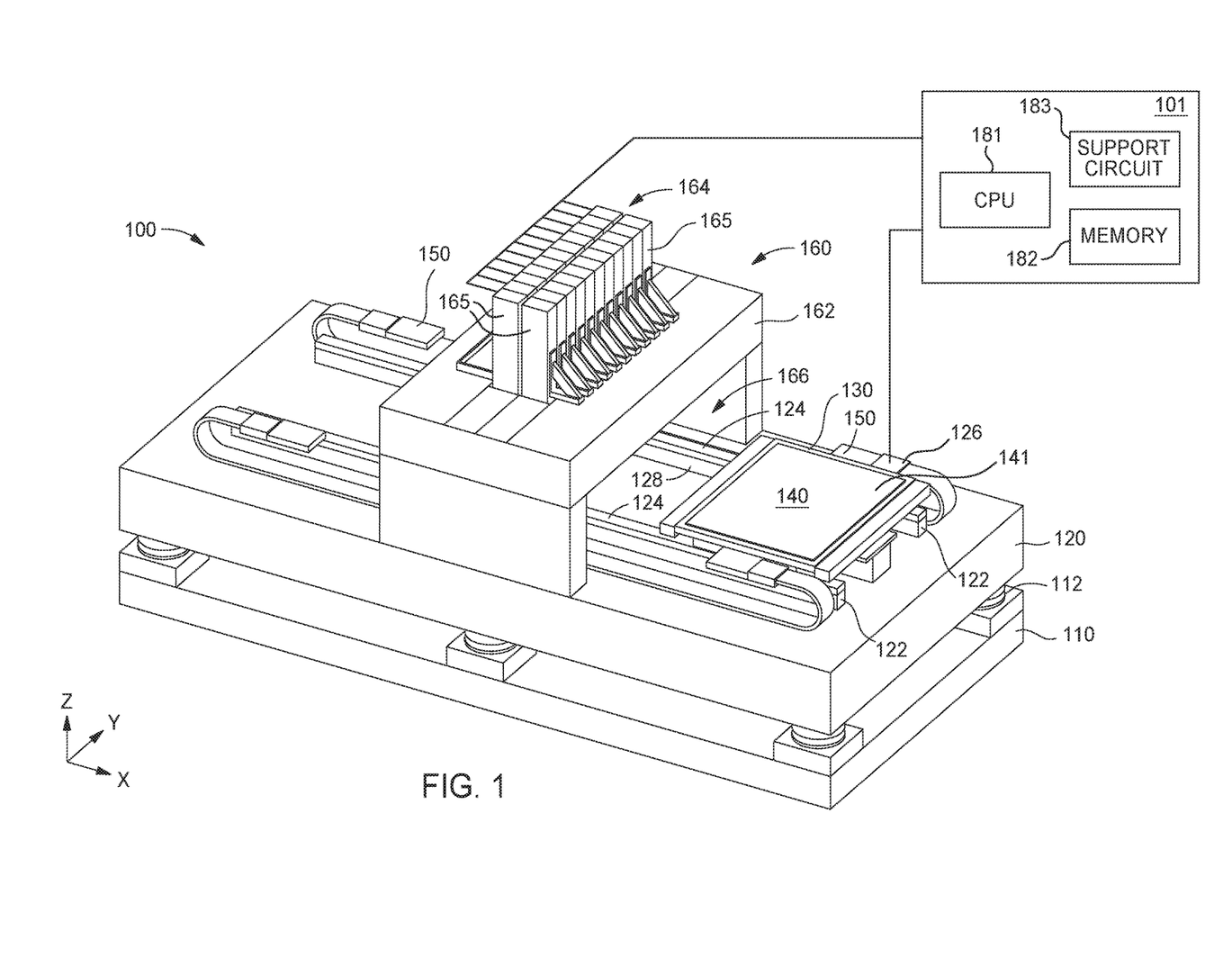
FIG. 1 is a schematic partial perspective view of a lithography system, according to one implementation.

FIG. 1 is a schematic partial perspective view of a lithography system 100, according to one implementation. The lithography system 100 includes a base frame 110, a slab 120, a stage 130, and a processing apparatus 160. The base frame 110 rests on the floor of a fabrication facility and supports the slab 120. Passive air isolators 112 are positioned between the base frame 110 and the slab 120. In one embodiment, which can be combined with other embodiments, the slab 120 is a monolithic piece of granite, and the stage 130 is disposed on the slab 120. A substrate 140 is supported by the stage 130. A plurality of openings are formed in the stage 130 to allow a plurality of lift pins to extend therethrough. The lift pins raise to an extended position to receive the substrate 140, such as from one or more transfer robots. The one or more transfer robots are used to load and unload substrates, such as the substrate 140, to and from the stage 130.

The substrate 140 includes any suitable material, for example, quartz used as part of a flat panel display. The substrate 140 can be made of other materials. The substrate 140 has a photoresist layer formed thereon. The photoresist layer is sensitive to radiation. A positive photoresist includes portions of the photoresist, which when exposed to radiation, will be respectively soluble to photoresist developer applied to the photoresist after the pattern is written into the photoresist. A negative photoresist includes portions of the photoresist, which when exposed to radiation, will be respectively insoluble to photoresist developer applied to the photoresist after the pattern is written into the photoresist. The chemical composition of the photoresist determines whether the photoresist will be a positive photoresist or negative photoresist. Examples of photoresists include, but are not limited to, one or more of diazonaphthoquinone, a phenol formaldehyde resin, poly(methyl methacrylate), poly (methyl glutarimide), and/or SU-8. During processing using the lithography system 100, a pattern is formed on a process surface 141 of the substrate 140 to form the electronic circuitry, such as electronic circuitry for use on a large-area flat panel display screen.

The lithography system 100 includes a pair of supports 122 and a pair of tracks 124. The pair of supports 122 are disposed on the slab 120, and the slab 120 and the pair of supports 122 are a single piece of material. The pair of tracks 124 are supported by the pair of the supports 122, and the stage 130 moves along the tracks 124 in the X-direction. The lithography system 100 can include one or more additional stages, in addition to the stage 130 illustrates. In one embodiment, which can be combined with other embodiments, the pair of tracks 124 is a pair of parallel magnetic channels. Each track 124 of the pair of tracks 124 is linear. In one embodiments, which can be combined with other embodiments, one or more of the tracks 124 is non-linear. An encoder 126 is coupled to the stage 130 in order to provide location information to a controller 101.

The processing apparatus 160 includes a support 162 and a processing unit 164. The support 162 is disposed on the slab 120 and includes an opening 166 for the stage 130 to pass under the processing unit 164. The processing unit 164 is supported by the support 162. In one embodiment, the processing unit 164 is a pattern generator configured to expose a photoresist in a photolithography process. In one embodiment, which can be combined with other embodiments, the pattern generator is configured to conduct a maskless lithography process. The processing unit 164 includes a plurality of image projection apparatus 200 (shown in FIGS. 2 and 3). In one embodiment, which can be combined with other embodiments, the processing unit 164 includes as many as 84 or more image projection apparatus. Each image projection apparatus is disposed in a case 165. The processing apparatus 160 can be used to conduct maskless direct patterning.

During operation of the lithography system 100, the stage 130 moves in an X-direction from a loading position, as shown in FIG. 1, to a processing position. The processing position includes one or more positions of the stage 130 as the stage 130 passes under the processing unit 164. During operation, the stage 130 is lifted by a plurality of air bearings and moves along the pair of tracks 124 from the loading position to the processing position. A plurality of vertical guide air bearings are coupled to the stage 130 and positioned adjacent an inner wall 128 of each support 122 to stabilize the movement of the stage 130. The stage 130 also moves in a Y-direction by moving along a track 150 for processing and/or indexing the substrate 140. The stage 130 is capable of independent operation and can scan a substrate 140 in one direction and step in the other direction.

A metrology system measures the X and Y lateral position coordinates of each of the stage 130 in real time so that each of the plurality of image projection apparatus can accurately locate the patterns being written in a photoresist covered substrate. The metrology system also provides a real-time measurement of the angular position of each of the stage 130 about a vertical or Z-axis. The angular position measurement can be used to hold the angular position constant during scanning using a servo mechanism. The angular position measurement can be used to apply corrections to the positions of the patterns being written on the substrate 140 by the image projection apparatus 200, shown in FIGS. 2 and 3. In one embodiment, which can be combined with other embodiments, these techniques are used in combination.

Figure 2:
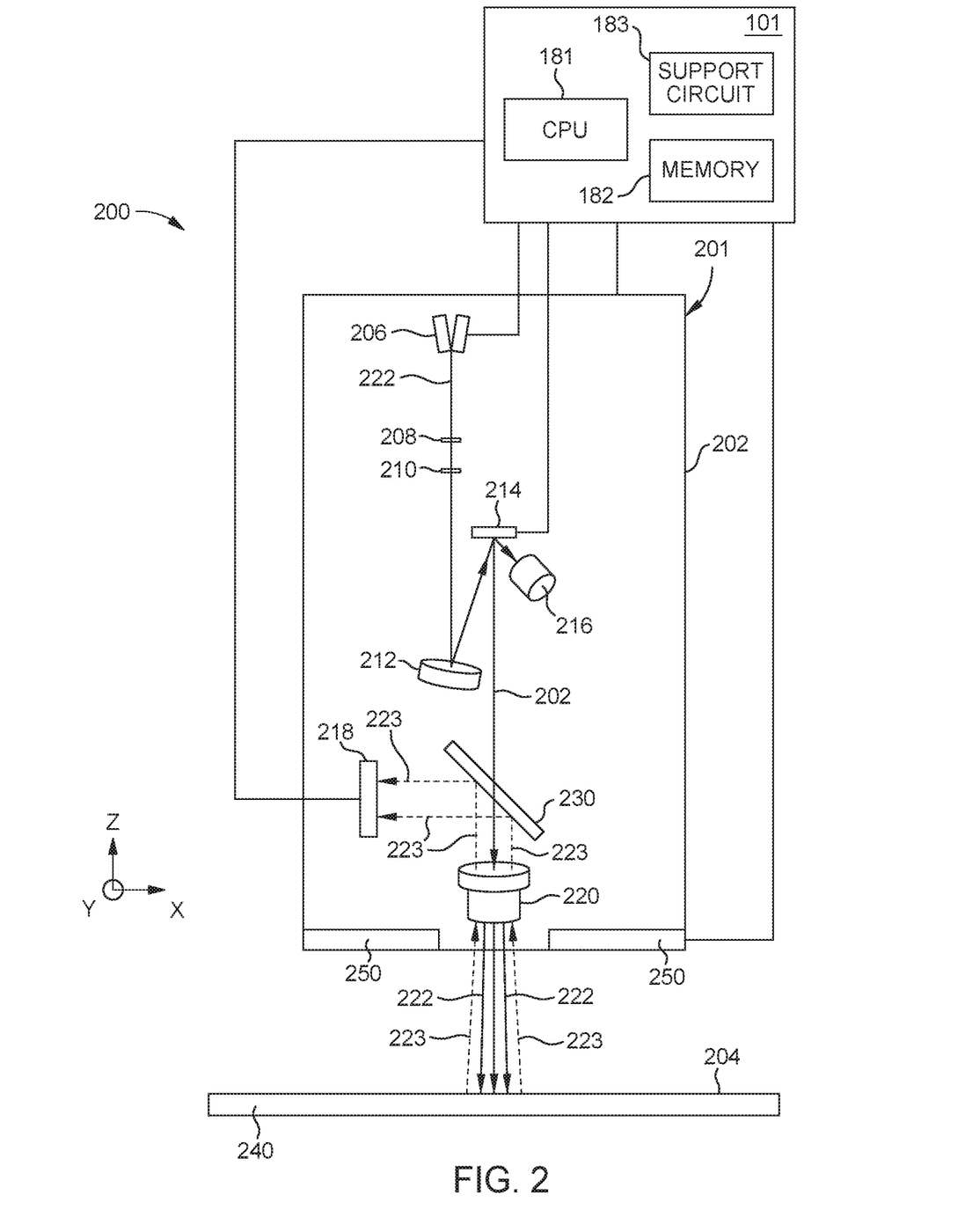
FIG. 2 is a perspective schematic view of an image projection apparatus used in the lithography system illustrated in FIG. 1 during a brightfield illumination operation, according to one implementation.

FIG. 2 is a perspective schematic view of an image projection apparatus 200 used in the lithography system 100 illustrated in FIG. 1 during a brightfield illumination operation, according to one implementation. The image projection apparatus 200 is used as each of the plurality of image projection apparatus corresponding to each of the cases 165 used in the lithography system 100 illustrated in FIG. 1. The image projection apparatus 200 includes an optical module 201. The optical module 201 includes a housing 202.

The image projection apparatus 200 directs a plurality of first light beams 222 toward a reflective surface 204 of a first substrate 240. The first substrate 240 may move in the X-direction and the Y-direction, as the first light beams 222 are directed toward the reflective surface 204. The first substrate 240 includes a mirror. In one embodiment, which can be combined with other embodiments, the reflective surface 204 is a continuous and planar surface.

The substrate 140 illustrated in FIG. 1 is patterned using the lithography system 100. The first substrate 240 illustrated in FIG. 2 is used to calibrate the lithography system 100, such as by adjusting the optical modules 201 of the image projection apparatus 200. Each of the image projection apparatus 200 includes a respective motor to control a tilt position, a tip position, and a vertical position of the respective optical module 201. The number of image projection apparatus 200 can vary based on the size of the substrate 140 and/or the speed of stage 130 (shown in FIG. 1).

The optical module 201 includes a light source 206, an aperture 208, a lens 210, a mirror 212, a digital mirror device (DMD) 214, a light dump 216, a camera 218, and a projection lens 220. The light source 206 includes light emitting diodes (LED's) or lasers. In one example, the light source 206 includes a broadband LED. The light source 206 is capable of producing light beams having a predetermined wavelength. In one embodiment, which can be combined with other embodiments, the predetermined wavelength is in the blue or near ultraviolet (UV) range, such as 450 nm or less. The mirror 212 includes a spherical mirror. The camera 218 may include for example, a CCD camera and/or a CMOS camera.

The projection lens 220 includes an objective lens, such as a 10× objective lens. The DMD 214 includes a plurality of mirrors, and the number of mirrors of the DMD 214 may correspond to the resolution of the projected image.

During operation, first light beams 222 having a predetermined wavelength, such as a wavelength in the blue range, are emitted by the light source 206. The first light beams 222 are reflected to the DMD 214 using the mirror 212. The mirrors of the DMD 214 may be controlled individually, and each mirror of the plurality of mirrors of the DMD 214 may be set at an "on" position or an "off" position, based on pattern data. The pattern data may be provided to the DMD 214 using the controller 101. When the first light beams 222 reach the mirrors of the DMD 214, the mirrors that are at the "on" position reflect the first light beams 222 to direct the first light beams 222 through a beam splitter 230 and toward the projection lens 220 to be projected onto the reflective surface 204. The projection lens 220 directs the first light beams 222 to the reflective surface 204 of the first substrate 240. The mirrors that are at the "off" position reflect the first light beams 222 to direct the first light beams 222 to the light dump 216 instead of the reflective surface 204 of the first substrate 240.

The first light beams 222 reflect off of the reflective surface 204 and are directed back toward the projection lens 220 as reflected first light beams 223. The reflected first light beams 223 are collected using at least the projection lens 220, and are directed toward the beam splitter 230. The reflected first light beams 223 reflect off of the beam splitter 230 and are directed toward the camera 218. The beam splitter 230 is oriented such that at least a portion of the light beams projecting toward the beam splitter 230 from the DMD 214 pass through the beam splitter 230 and project toward the projection lens 220. The beam splitter 230 is oriented such that at least a portion of the light beams projecting toward the beam splitter 230 from the projection lens 220 are reflected toward the camera 218.

The camera 218 takes a plurality of first images of the image plane projected onto the reflective surface 204. The first images taken by the camera 218 include the reflected first light beams 223 that reflect off of the reflective surface 204. The camera 218 transmits the plurality of first images including the reflected first light beams 223 to the controller 101.

The optical module 201 is moved vertically while the first light beams 222 are projected onto the reflective surface 204 and the camera 218 takes the first images that include the reflected first light beams 223. In one embodiment, which can be combined with other embodiments, the optical module 201 is moved vertically upward and/or downward along the Z-axis and relative to the first substrate 240. In one example, the optical module 201 moves across a plurality of vertical positions. In one embodiment, which can be combined with other embodiments, the first images taken using the camera 218 correspond to a plurality of vertical positions of the optical module 201. In one embodiment, which can be combined with other embodiments, the optical module 201 is disposed at a tip position and a tilt position while the optical module 201 moves vertically and the camera 218 takes the first images.

The projection lens 220 is part of a first illumination source that is a brightfield illumination source. The brightfield illumination source projects the first light beams 223 toward the reflective surface 204 within a field of view of the projection lens 220.

During calibration of the lithography system 100 using the first substrate 240, the first substrate 240 is not patterned by the first light beams 222. In one embodiment, which can be combined with other embodiments, the first substrate 240 does not include a photoresist layer formed thereon.

In the implementation shown in FIG. 2, the optical module 201 includes a spatial light modulator (SLM) that is a part of the brightfield illumination source. In the implementation shown, the SLM includes the DMD 214. The present disclosure contemplates that other SLM's and associated aspects thereof may be used in place of one or more aspects of the optical module 201 (such as in place of the DMD 214 and/or the light source 206). In one embodiment, which can be combined with other embodiments, the optical module 201 includes microLED arrays, VCSEL arrays, and/or LCD arrays as part of the first illumination source that is a brightfield illumination source. In one example, the microLED arrays, the VCSEL arrays, and/or the LCD arrays are used and one or more of the DMD 214, the light source 206, the aperture 208, the lens 210, the mirror 212, and/or the light dump 216 are omitted.

Figure 3:
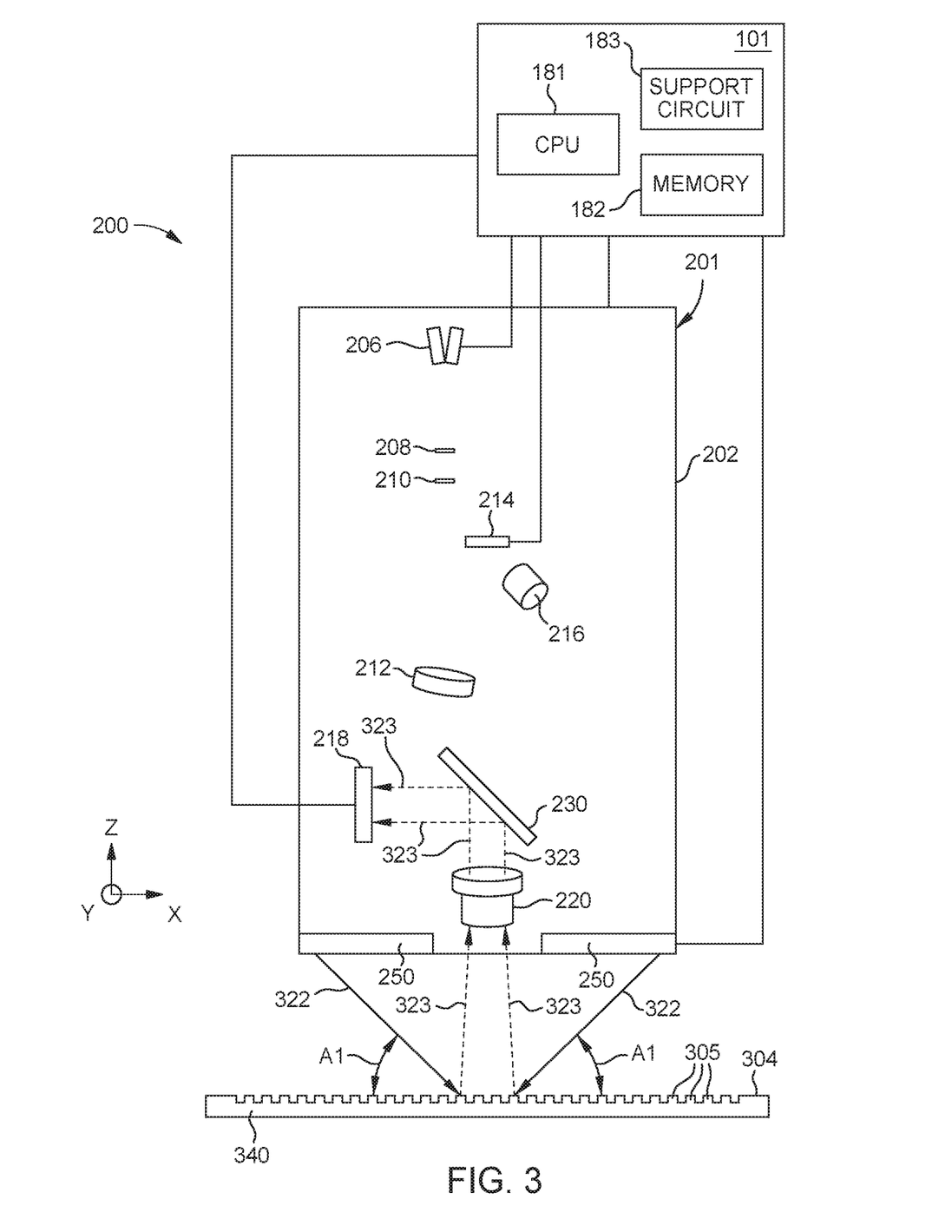
FIG. 3 is a perspective schematic view of the image projection apparatus used in the lithography system illustrated in FIG. 1 during a darkfield illumination operation, according to one implementation.

FIG. 3 is a perspective schematic view of the image projection apparatus 200 used in the lithography system 100 illustrated in FIG. 1 during a darkfield illumination operation, according to one implementation.

The optical module 201 includes an illumination source 250 disposed below the projection lens 220. In one embodiment, which can be combined with other embodiments, the illumination source 250 is coupled to the projection lens 220, and is disposed circumferentially about the projection lens 220.

The illumination source 250 directs a plurality of second light beams 322 toward a patterned surface 304 of a second substrate 340. The second light beams 322 are directed toward the patterned surface 304 at an oblique angle A1 relative to the patterned surface 304. The second substrate 340 is different than the first substrate 240 described above. The patterned surface 304, is patterned for example, using lithography operations, deposition operations, and/or etching operations. The patterned surface 304 includes a plurality of structures 305 formed thereon to scatter the second light beams 322. The illumination source 250 is a second illumination source. The illumination source 250 includes a darkfield illumination source that projects the second light beams 322 toward the patterned surface 304 from locations disposed outside of the field of view of the projection lens 220.

The second substrate 340 illustrated in FIG. 3 is used to calibrate the lithography system 100, such as by adjusting the optical modules 201 of the image projection apparatus 200.

In one example, the illumination source 250 includes a ring and a plurality of light emitters, such as LED's and/or laser emitters, that emit the second light beams 322. In one example, the illumination source 250 includes broadband LED's. The illumination source 250 is capable of producing light beams having a predetermined wavelength. In one embodiment, which can be combined with other embodiments, the predetermined wavelength is in the blue or near ultraviolet (UV) range, such as 450 nm or less.

In one embodiment, which can be combined with other embodiments, the illumination source 250 includes a spatial light modulator (SLM). In one example, the illumination source 250 includes one or more of a digital mirror device (DMD), microLED arrays, VCSEL arrays, and/or LCD arrays.

During operation, second light beams 322 having a predetermined wavelength, such as a wavelength in the blue range, are emitted by the illumination source 250. The second light beams 322 are directed to the patterned surface 304. The second light beams 322 are scattered using the structures 305, and are directed toward the projection lens 220 as scattered second light beams 323. The scattered second light beams 323 are collected using at least the projection lens 220, and are directed toward the beam splitter 230. The scattered second light beams 323 reflect off of the beam splitter 230 and are directed toward the camera 218. In one embodiment, which can be combined with other embodiments, the wavelength of the second light beams 322 projected using the darkfield illumination source is about the same as the wavelength of the first light beams 222 projected using the brightfield illumination source. In one example, the wavelength of the second light beams 322 is within a 50 nm difference of the wavelength of the first light beams 222.

The camera 218 takes a plurality of second images of the image plane projected onto the patterned surface 304. The second images taken by the camera 218 include the scattered second light beams 323 that scatter off of the patterned surface 304. The camera 218 transmits the plurality of second images including the scattered second light beams 323 to the controller 101.

In one embodiment, which can be combined with other embodiments, the reflected first light beams 223 are reflected brightfield light beams and the scattered second light beams 323 are scattered darkfield light beams.

The optical module 201 is moved vertically while the second light beams 322 are projected onto the patterned surface 304 and the camera 218 takes the second images that include the scattered second light beams 323. In one embodiment, which can be combined with other embodiments, the optical module 201 is moved vertically upward and/or downward along the Z-axis and relative to the second substrate 340. In one example, the optical module 201 moves across a plurality of vertical positions. In one embodiment, which can be combined with other embodiments, the second images taken using the camera 218 correspond to a plurality of vertical positions of the optical module 201. In one embodiment, which can be combined with other embodiments, the optical module 201 is disposed at a tip position and a tilt position while the optical module 201 moves vertically and the camera 218 takes the second images.

During calibration of the lithography system 100 using the second substrate 340, the second substrate 340 is not patterned by the second light beams 322.

The controller 101 is in communication with aspects of the lithography system 100 and is configured to control aspects of the lithography system 100. In one example, the controller 101 is in communication with, and configured to control, the optical modules 201 and corresponding motors, cameras 218, DMD's 214, light sources 206, and/or illumination sources 250. In one example, the controller 101 is configured to adjust the tilt position, the tip position, and the vertical position of the optical modules 205. The tilt position is an angular position of the optical module 205 about the X-axis. The tip position is an angular position of the optical module 205 about the Y-axis. The vertical position is a lateral position of the optical module 205 along the Z-axis. In one embodiment, which can be combined with other embodiments, each of the X-axis, the Y-axis, and the Z-axis extends through a center of the respective optical module 205.

The controller 101 receives the plurality of first images from the camera 218 that include the reflected first light beams 223. The first images correspond to a plurality of vertical positions of the optical module 205. For each of the first images, the controller 101 processes outer areas (e.g., corner areas) of the respective image and analyzes a resolution of each outer area. In one example, the corner areas of the first images that are analyzed include a top-left corner area, a top-right corner area, a bottom-left corner area, and a bottom-right corner area. The resolution indicates a number of pixels within the respective corner area, a focus level, and/or an amount of lighted area of the respective corner area that is recognized by the controller 101 or the camera 218. In one embodiment, which can be combined with other embodiments, the pixels correspond to the reflected first light beams 223 appearing in the respective corner area of the respective first image. In one embodiment, which can be combined with other embodiments, the resolution indicates a measured light intensity of light within the respective corner area. The resolution for each outer area is analyzed for each of the first images (e.g., for each of the vertical positions), and an optimal first image is determined for each of the outer areas. For each outer area, the optimal first image is the first image, and the corresponding vertical position, at which the respective corner area has the highest resolution. In one example, the highest resolution is an optimal focus level having an optimal clarity, the largest measured light intensity, the largest amount of lighted area recognized by the controller 101 and/or the camera 218, and/or the largest number of pixels. An optimal first image is determined for each of the top-left corner area, the top-right corner area, the bottom-left corner area, and the bottom-right corner area.

Using the optimal first image for each of the outer areas, the controller 101 determines an optimal brightfield tilt, an optimal brightfield tip, and an optimal brightfield vertical position. The optimal brightfield vertical position is determined by using the corresponding vertical positions of the optimal first images for the corner areas, and calculating an average of the corresponding vertical positions. The first images and the second images each include a first image length extending along the left and right sides and a second image length extending along the top and bottom sides in the image plane.

As shown in Equation 1 below, the optimal brightfield tilt ($Tilt_{BF}$) is determined by calculating a sine of a first brightfield difference D1 divided by the first image length L1.

$$Tilt_{BF} = \sin(D1/L1) \tag{Equation 1}$$

In one example, the first brightfield difference D1 is determined by subtracting the corresponding vertical position of the optimal first image for the bottom-left corner from the corresponding vertical position of the optimal first image for the top-left corner. In one example, the first brightfield difference D1 is determined by subtracting the corresponding vertical position of the optimal first image for the bottom-right corner from the corresponding vertical position of the optimal first image for the top-right corner.

As shown in Equation 2 below, the optimal brightfield tip ($Tip_{BF}$) is determined by calculating a sine of a second brightfield difference D2 divided by the second image length L2.

$$Tip_{BF} = \sin(D2/L2) \tag{Equation 2}$$

In one example, the second brightfield difference D2 is determined by subtracting the corresponding vertical position of the optimal first image for the top-right corner from the corresponding vertical position of the optimal first image for the top-left corner. In one example, the second brightfield difference D2 is determined by subtracting the corresponding vertical position of the optimal first image for the bottom-right corner from the corresponding vertical position of the optimal first image for the bottom-left corner.

The controller 101 receives the plurality of second images from the camera 218 that include the scattered second light beams 323. The second images correspond to a plurality of vertical positions of the optical module 205. For each of the second images, the controller 101 processes outer areas (e.g., corner areas) of the respective image and analyzes a resolution of each corner area. In one example, the corner areas of the second images that are analyzed include a top-left corner area, a top-right corner area, a bottom-left corner area, and a bottom-right corner area. The resolution indicates a number of pixels within the respective corner area, a focus level, and/or an amount of lighted area of the respective corner area that is recognized by the controller 101 or the camera 218. In one embodiment, which can be combined with other embodiments, the pixels correspond to the scattered second light beams 323 appearing in the respective outer area of the respective second image. In one embodiment, which can be combined with other embodiments, the resolution indicates a measured light intensity of light within the respective corner area. The resolution for each outer area is analyzed for each of the second images (e.g., for each of the vertical positions), and an optimal second image is determined for each of the outer areas. For each outer area, the optimal second image is the second image, and the corresponding vertical position, at which the respective outer area has the highest resolution. In one example, the highest resolution is an optimal focus level having an optimal clarity, the largest measured light intensity, the largest amount lighted area recognized by the controller 101 and/or the camera 218, and/or the largest number of pixels. An optimal second image is determined for each of the top-left corner area, the top-right corner area, the bottom-left corner area, and the bottom-right corner area.

Using the optimal second image for each of the outer areas, the controller 101 determines an optimal darkfield tilt, an optimal darkfield tip, and an optimal darkfield vertical position. The optimal darkfield vertical position is determined by using the corresponding vertical positions of the optimal second images for the corner areas, and calculating an average of the corresponding vertical positions.

As shown in Equation 3 below, the optimal darkfield tilt ($Tilt_{DF}$) is determined by calculating a sine of a first darkfield difference D3 divided by the first image length L1.

$$Tilt_{DF} = \sin(D3/L1) \tag{Equation 3}$$

In one example, the first darkfield difference D3 is determined by subtracting the corresponding vertical position of the optimal second image for the bottom-left corner from the corresponding vertical position of the optimal second image for the top-left corner. In one example, the first darkfield difference D3 is determined by subtracting the corresponding vertical position of the optimal second image for the bottom-right corner from the corresponding vertical position of the optimal second image for the top-right corner.

As shown in Equation 4 below, the optimal darkfield tip ($Tip_{DF}$) is determined by calculating a sine of a second darkfield difference D4 divided by the second image length L2.

$$Tip_{DF} = \sin(D4/L2) \tag{Equation 4}$$

In one example, the second darkfield difference D4 is determined by subtracting the corresponding vertical position of the optimal second image for the top-right corner from the corresponding vertical position of the optimal second image for the top-left corner. In one example, the second darkfield difference D4 is determined by subtracting the corresponding vertical position of the optimal second image for the bottom-right corner from the corresponding vertical position of the optimal second image for the bottom-left corner.

In one embodiment, which can be combined with other embodiments, the optimal first image is an optimal brightfield image and the optimal second image is an optimal darkfield image.

The controller 101 then determines a tip correction, a tilt correction, and an optimal vertical position for the optical module 205. As shown in Equation 5 (below), the tilt correction (X) is determined by multiplying the optimal brightfield tilt ($Tilt_{BF}$) by a factor of 2.0 to determine a tilt value, and subtracting the tilt value from the optimal darkfield tilt ($Tilt_{DF}$):

$$X = Tilt_{DF} - (2 * Tilt_{BF}) \tag{Equation 5}$$

As shown in Equation 6 (below), the tip correction (Y) is determined by multiplying the optimal brightfield tip ($Tip_{BF}$) by a factor of 2.0 to determine a tip value, and subtracting the tip value from the optimal darkfield tip ($Tip_{DF}$):

$$Y = Tip_{DF} - (2 * Tip_{BF}) \tag{Equation 6}$$

As shown in Equation 7 (below), the optimal vertical position ($Z_L$) is determined by multiplying the optimal brightfield vertical position ($Z_{BF}$) by a factor of 2.0 to determine a vertical value, and subtracting the optimal darkfield vertical position ($Z_{DF}$) from the vertical value:

$$Z_L = (2 * Z_{BF}) - Z_{DF} \tag{Equation 7}$$

The controller 101 instructs the motor to adjust the tilt position (which was used during the taking of the first images and the second images) of the optical module 205 to a corrected tilt position using the tilt correction (X). The corrected tilt position is a corrected angular position of the optical module 205 about the X-axis after the tilt correction is applied to the tilt position.

In one embodiment, which can be combined with other embodiments, each of the tilt correction (X) and the tip correction (Y) includes an angular value, and the optimal vertical position ($Z_L$) includes a translational value.

The controller 101 instructs the motor to adjust the tip position (which was used during the taking of the first images and the second images) of the optical module 205 to a corrected tip position using the tip correction (Y). The corrected tip position is a corrected angular position of the optical module 205 about the Y-axis after the tip correction is applied to the tip position.

The controller 101 instructs the motor to adjust the vertical position of the optical module 205 to a corrected vertical position using the optimal vertical position ($Z_L$). The corrected vertical position is approximately equal to the optimal vertical position ($Z_L$) along the Z-axis.

After adjusting to the corrected tilt position, the corrected tip position, and the corrected vertical position, the optical module 205 is used to pattern substrates (such as the substrate 140 illustrated in FIG. 1) using lithography operations.

The controller 101 includes a processor 181, such as a central processing unit (CPU), a memory 182, and a support circuit 183 for the processor 181. The controller 180 may be one of any form of general-purpose computers that can be used in an industrial setting for controlling various lithography system components and sub-processors. The memory 182 stores software (source or object code), such as a computer program, that may be executed or invoked to control the overall operations of the lithography system 100 and/or optical modules 205 in manners described herein.

The controller 101 includes a non-transitory computer-readable medium (such as the memory 182) including instructions (such as the software) that when executed (such as by the processor 181) causes one or more of the operations described herein to be conducted. In one embodiment, which can be combined with other embodiments, the instructions, when executed, cause one or more of the operations described in relation to FIGS. 1-6 to be conducted. In one embodiment, which can be combined other embodiments, the instructions of the non-transitory computer-readable medium of the controller 101, when executed, cause one or more operations of the method 600 to be conducted. In one example, the instructions cause one or more of operations 601-621 to be conducted in relation to the lithography system 100 and/or the optical modules 205 and/or the aspects and/or components thereof.

Aspects described herein facilitate projecting light toward substrates (to pattern the substrates during lithography operations) at an image plane that is substantially parallel with substrates surfaces that are to be patterned. Aspects described herein also facilitate projecting light toward substrates at an image plane that is within focus across substantially the entirety of the image plane. As an example, adjusting optical modules to the corrected tip positions, the corrected tilt positions, and the corrected vertical positions facilitates adjusting the optical modules 205 such that the optical modules 205 image planes that are in focus and parallel to substrates that the projected image planes are patterning. Aspects described herein facilitate simply, quickly, and effectively calibrating the tilt, tip, and vertical positions of optical modules 205. As an example, aspects described herein facilitate simply calibrating the optical modules 205 of the lithography system 105 using the same optical modules 205 that are used to pattern substrates. The calibration can be conducted quickly, for example, in a time period of 10 minutes or less.

Calibrating optical modules 205 using the tip correction, the tilt correction, and the optimal vertical position can also account for structural defects in the optical modules 205, such as mura on lenses of the optical modules. Calibrating optical modules 205 also can account for positions defects in the optical modules 205, such as certain components being misaligned. Calibrating the optical modules 205 using aspects described herein also facilitates effective and accurate patterning of substrates with reduced mura on the substrates, facilitating increased throughput, reduced machine downtime, reduced production time, and reduced operational costs.

Figure 4A:
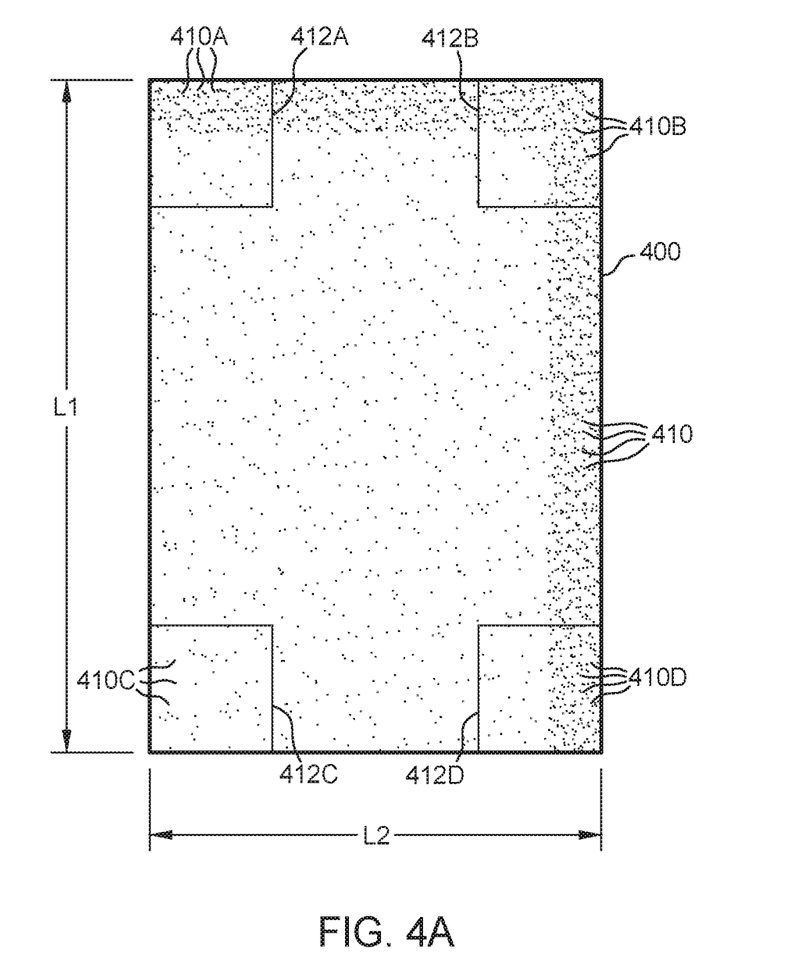
FIG. 4A is a schematic partial view of an image taken by the camera illustrated in FIGS. 2 and 3, according to one implementation.

FIG. 4A is a schematic partial view of an image 400 taken by the camera 218 illustrated in FIGS. 2 and 3, according to one implementation. The image 400 includes the first image length L1 and the second image length L2 in the image plane. The image 400 may be an example of one of the plurality of first images that include the reflected first light beams 223. The image 400 may be an example of one of the plurality of second images that include the scattered second light beams 323. The image 400 includes a plurality of image features 410 (e.g., pixels). In one example, when analyzing the first images, the image features 410 correspond to the reflected first light beams 223 appearing within the respective image 400. In one example, when analyzing the second images, the image features 410 correspond to the scattered second light beams 323 appearing within the respective image 400.

The image 400 includes corner areas 412A-412D (a top-left corner area 412A, a top-right corner area 412B, a bottom-left corner area 412C, and a bottom-right corner area 412D) that are processed and analyzed. A resolution for each of the corner areas 412A-412D is analyzed. In one example, the resolution of each corner area 412A-412D includes the number of image features 410A-410D (e.g., pixels) appearing within the respective corner area 412A-412D. In one example, the resolution of each corner area 412A-412D includes the measured light intensity of light appearing within the respective corner area 412A-412D.

Figure 4B:
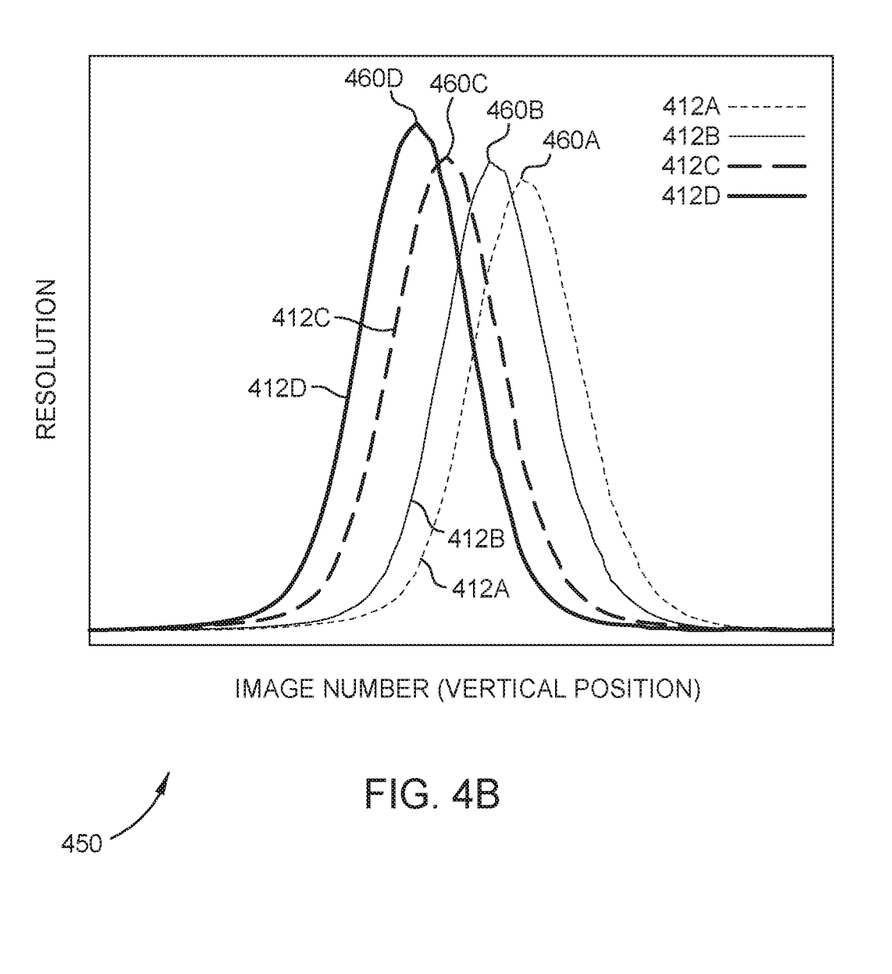
FIG. 4B is a schematic illustration of a graph of the analyzed resolutions of the respective first images or second images, according to one implementation.

FIG. 4B is a schematic illustration of a graph 450 of the analyzed resolutions of the respective first images or second images, according to one implementation. The Y-axis of the graph 450 represents the resolution of the respective corner area 412A-412D of the respective first images or second images. In one example, the resolution is the number of image features (e.g., pixels) appearing within the respective corner area 412A-412D. In one example, the resolution is the measured light intensity of light within the respective corner area 412A-412D. The X-axis of the graph 450 represents the image number of the respective first image or second image. The image number of the X-axis corresponds to the corresponding vertical position of the optical module 205 at which the image was taken by the camera 218. The resolutions across the respective first images or the second images are mapped for each of the corner areas 412A-412D and displayed in the graph 450. A peak 460A-460D is shown in the graph 450 for each of the corner areas 412A-412D. The peak 460A-460D for each respective corner area 412A-412D corresponds to the image number (and corresponding vertical position) at which the respective corner area 412A-412D has the highest resolution. The image number (and corresponding vertical position) indicates an optimal first image (if the first images are analyzed) or an optimal second image (if the second images are analyzed) for each respective corner area 412A-412D.

Figure 5:
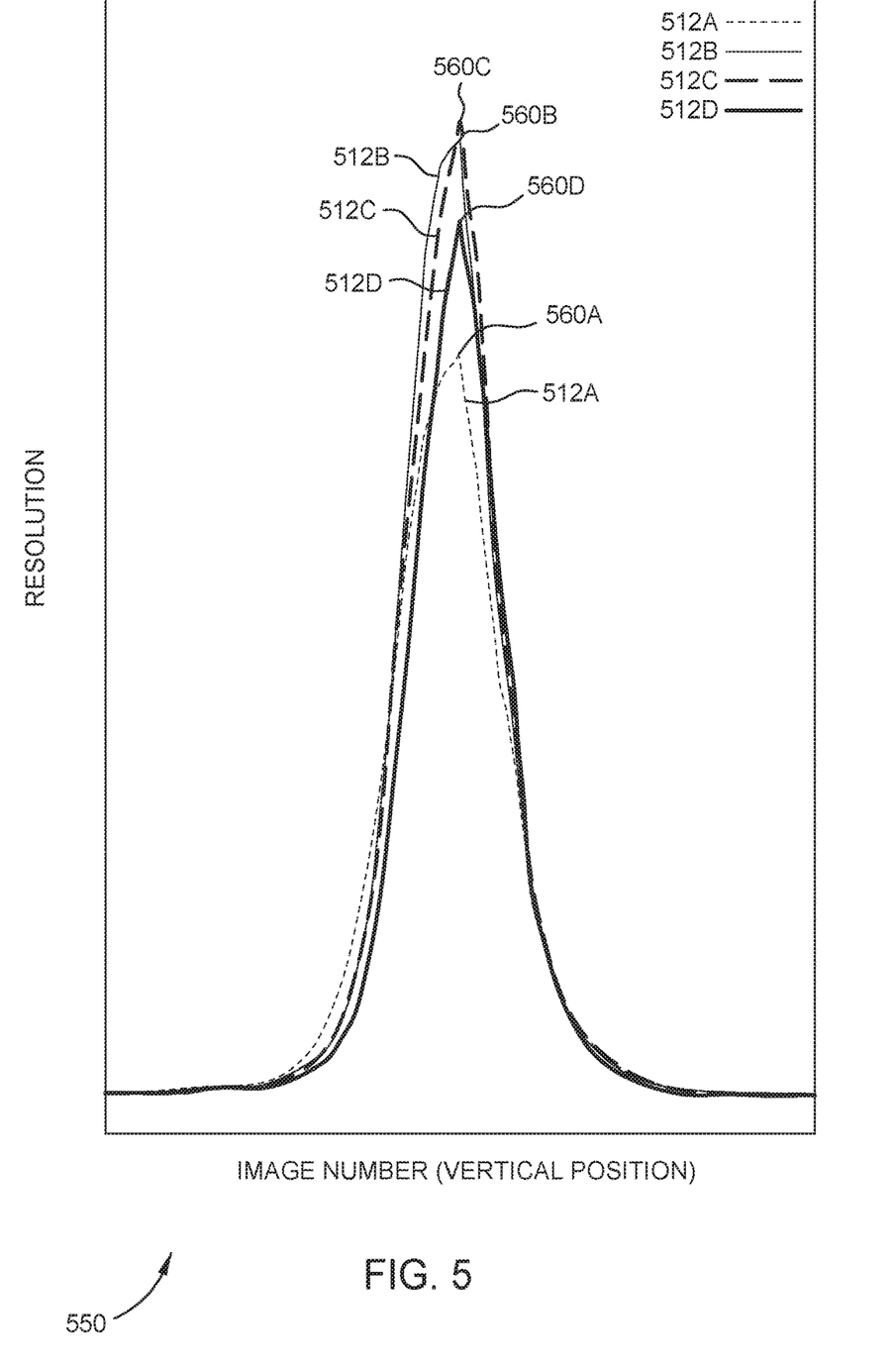
FIG. 5 is a schematic illustration of a graph of analyzed resolutions of images taken using the camera after correcting the optical module, according to one implementation.

FIG. 5 is a schematic illustration of a graph 550 of analyzed resolutions of images taken using the camera 218 after correcting the optical module 205, according to one implementation. The images mapped in the graph 550 are taken after the tilt position of the optical module 205 is corrected to the corrected tilt position using the tilt correction, and the tip position is corrected to the corrected tip position using the tip correction. The resolutions of respective corner areas 512A-512D are mapped in the graph 550. The resolutions of the corner areas 512A-512D are more aligned across image numbers (and corresponding vertical positions) as compared to the corner areas 412A-412D illustrated in FIG. 4B. Peaks 560A-560D of resolutions for the respective corners areas 412A 412D are aligned and occurring at the same image number (and corresponding vertical position to facilitate accurate patterning and a parallel image plane that is in focus. The peaks 560A-560D of resolutions are also higher, after tip and tilt corrections, than the peaks 460A-460D illustrated in FIG. 4B. The graph 550 is exemplary.

Figure 6:
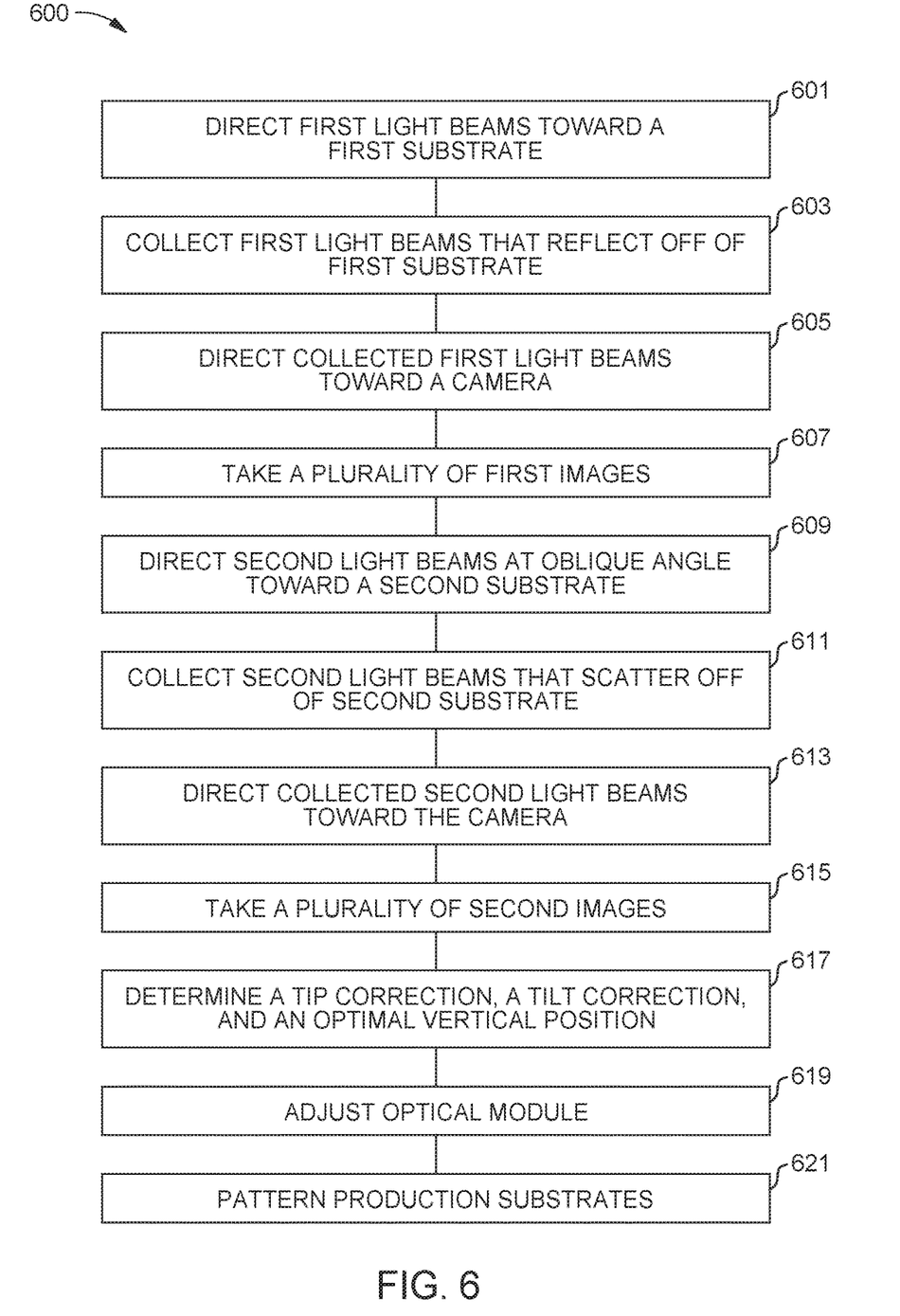
FIG. 6 is a schematic illustration of a method of operating a lithography system, according to one implementation.

FIG. 6 is a schematic illustration of a method 600 of operating a lithography system, according to one implementation. At operation 601, the method 600 includes directing first light beams toward a reflective surface of a first substrate using a digital mirror device of an optical module. Operation 603 includes collecting the first light beams that reflect off of the reflective surface of the first substrate through at least an objective lens of the optical module. Operation 605 includes directing the first light beams collected through at least the objective lens toward a camera of the optical module using a beam splitter of the optical module. Operation 607 includes taking a plurality of first images, using the camera, of the first light beams directed toward the camera. Operation 609 includes directing second light beams at an oblique angle toward a patterned surface of a second substrate using an illumination source disposed below the objective lens. Operation 611 includes collecting the second light beams that scatter off of the patterned surface through at least the objective lens. Operation 613 includes directing the second light beams collected through at least the objective lens toward the camera using a beam splitter. Operation 615 includes taking a plurality of second images, using the camera, of the second light beams directed toward the camera.

Operation 617 includes determining a tip correction, a tilt correction, and an optimal vertical position for the optical module. Operation 619 includes adjusting a tip position of the optical module to a corrected tip position using the tip correction, and adjusting a tilt position of the optical module to a corrected tilt position using the tilt correction. Operation 619 also includes adjusting a vertical position of the optical module to a corrected vertical position using the optimal vertical position.

In one embodiment, which can be combined with other embodiments, the first light beams are brightfield light beams and the second light beams are darkfield light beams. In one embodiment, which can be combined with other embodiments, the first images are brightfield images and the second images are darkfield images. In one embodiment, which can be combined with other embodiments, the objective lens is at least a part of a brightfield illumination source and the illumination source is at least a part of a darkfield illumination source. In one embodiment, which can be combined with other embodiments, the first substrate and the second substrate are test substrates.

Operation 621 includes patterning one or more production substrates using the lithography system with the optical module corrected to the corrected tip position, the corrected tilt position, and the corrected vertical position.

Benefits of the present disclosure include quickly and effective correcting tip positions, tilt positions, and vertical positions of optical modules; simply correcting optical modules with reduced expenditure of resources; correcting for defects in optical modules; projecting light at image planes that are parallel to substrates; projecting light at image planes that are in focus; accurately patterning substrates; reduced mura on patterned substrates; increased throughput; reduced production time; reduced machine downtime; and reduced operational costs.

Aspects of the present disclosure include a lithography system 100; optical modules 205; camera 218; first substrate 240; second substrate 340; first light beams 223; reflected first light beams 223; second light beams 322; scattered second light beams 323; controller 101; first images; second images; corner areas 412A-412D of images 400; and method 600. It is contemplated that one or more aspects disclosed herein may be combined. Moreover, it is contemplated that one or more aspects disclosed herein may include some or all of the aforementioned benefits.

While the foregoing is directed to embodiments of the present disclosure, other and further embodiments of the disclosure may be devised without departing from the basic scope thereof. The present disclosure also contemplates that one or more aspects of the embodiments described herein may be substituted in for one or more of the other aspects described. The scope of the disclosure is determined by the claims that follow.

What is claimed is:

1. A method of operating a lithography system, comprising:
   directing first light beams toward a reflective surface of a first substrate using a spatial light modulator of an optical module;
   collecting the first light beams that reflect off of the reflective surface through at least an objective lens of the optical module;
   directing the first light beams collected through at least the objective lens toward a camera of the optical module using a beam splitter of the optical module;
   taking a plurality of first images, using the camera, of the first light beams directed toward the camera;
   directing second light beams at an oblique angle toward a patterned surface of a second substrate using an illumination source disposed below the objective lens;
   collecting the second light beams that scatter off of the patterned surface through at least the objective lens;
   directing the second light beams collected through at least the objective lens toward the camera using the beam splitter;
   taking a plurality of second images, using the camera, of the second light beams directed toward the camera; and
   determining a tip correction, a tilt correction, and an optimal vertical position for the optical module.

2. The method of claim 1, wherein the plurality of first images are taken while moving the optical module vertically relative to the first substrate, the plurality of first images corresponding to a plurality of vertical positions of the optical module.

3. The method of claim 2, wherein the plurality of second images are taken while moving the optical module vertically relative to the second substrate, the plurality of second images corresponding to a plurality of vertical positions of the optical module.

4. The method of claim 1, wherein the first substrate comprises a mirror, and the patterned surface of the second substrate comprises a plurality of structures formed thereon to scatter the second light beams off of the second substrate.

5. The method of claim 1, wherein the determining the tip correction, the tilt correction, and the optimal vertical position comprises processing outer areas of the plurality of first images and outer areas of the plurality of second images, wherein the processing comprises:
   analyzing a resolution of each outer area of the plurality of first images; and
   determining an optimal first image for each outer area of the plurality of first images, the optimal first image including the highest resolution for the respective outer area of the plurality of first images.

6. The method of claim 5, wherein the processing further comprises:
   analyzing a resolution of each outer area of the plurality of second images; and
   determining an optimal second image for each outer area of the plurality of second images, the optimal second image including the highest resolution for the respective outer area of the plurality of second images.

7. The method of claim 6, wherein the outer areas of the plurality of first images are corner areas and the outer areas of the plurality of second images are corner areas.

8. The method of claim 1, further comprising:
   adjusting a tip position of the optical module using the tip correction;
   adjusting a tilt position of the optical module using the tilt correction; and
   adjusting a vertical position of the optical module using the optimal vertical position.

9. A non-transitory computer-readable medium comprising instructions that, when executed, cause a lithography system to:
   direct first light beams toward a reflective surface of a first substrate using a spatial light modulator of an optical module;
   collect the first light beams that reflect off of the reflective surface through at least an objective lens of the optical module;
   direct the first light beams collected through at least the objective lens toward a camera of the optical module using a beam splitter of the optical module;
   take a plurality of first images, using the camera, of the first light beams directed toward the camera;
   direct second light beams at an oblique angle toward a patterned surface of a second substrate using an illumination source disposed below the objective lens;
   collect the second light beams that scatter off of the patterned surface through at least the objective lens;
   direct the second light beams collected through at least the objective lens toward the camera using the beam splitter;
   take a plurality of second images, using the camera, of the second light beams directed toward the camera; and
   determine a tip correction, a tilt correction, and an optimal vertical position for the optical module.

10. The non-transitory computer-readable medium of claim 9, wherein the plurality of first images are taken while moving the optical module vertically relative to the first substrate, the plurality of first images corresponding to a plurality of vertical positions of the optical module.

11. The non-transitory computer-readable medium of claim 10, wherein the plurality of second images are taken while moving the optical module vertically relative to the second substrate, the plurality of second images corresponding to a plurality of vertical positions of the optical module.

12. The non-transitory computer-readable medium of claim 9, wherein the first substrate comprises a mirror, and the patterned surface of the second substrate comprises a plurality of structures formed thereon to scatter the second light beams off of the second substrate.

13. The non-transitory computer-readable medium of claim 9, wherein the determining the tip correction, the tilt correction, and the optimal vertical position comprises processing outer areas of the plurality of first images and outer areas of the plurality of second images, wherein the processing comprises:
   analyzing a resolution of each outer area of the plurality of first images; and
   determining an optimal first image for each outer area of the plurality of first images, the optimal first image including the highest resolution for the respective outer area of the plurality of first images.

14. The non-transitory computer-readable medium of claim 13, wherein the processing further comprises:
   analyzing a resolution of each outer area of the plurality of second images; and
   determining an optimal second image for each outer area of the plurality of second images, the optimal second image including the highest resolution for the respective outer area of the plurality of second images.

15. The non-transitory computer-readable medium of claim 14, wherein the outer areas of the plurality of first images are corner areas and the outer areas of the plurality of second images are corner areas.

16. The non-transitory computer-readable medium of claim 9, wherein the instructions, when executed, further cause the lithography system to:
   adjust a tip position of the optical module using the tip correction;
   adjust a tilt position of the optical module using the tilt correction; and
   adjust a vertical position of the optical module using the optimal vertical position.

17. A non-transitory computer-readable medium comprising instructions that, when executed, cause a lithography system to:
   direct brightfield light beams toward a reflective surface of a first substrate using a spatial light modulator of an optical module;
   take a plurality of brightfield images, using a camera of the optical module, of reflected brightfield light beams that reflect off of the reflective surface;
   direct darkfield light beams toward a patterned surface of a second substrate;
   take a plurality of darkfield images, using the camera, of scattered darkfield light beams that scatter off of the patterned surface; and
   determine a tip correction, a tilt correction, and an optimal vertical position for the optical module.

18. The non-transitory computer-readable medium of claim 17, wherein the determining the tip correction, the tilt correction, and the optimal vertical position comprises processing outer areas of the plurality of brightfield images and outer areas of the plurality of darkfield images, wherein the processing comprises:
   analyzing a resolution of each outer area of the plurality of brightfield images; and
   determining an optimal brightfield image for each outer area of the plurality of brightfield images, the optimal brightfield image including the highest resolution for the respective outer area of the plurality of brightfield images.

19. The non-transitory computer-readable medium of claim 18, wherein the processing further comprises:

analyzing a resolution of each outer area of the plurality of darkfield images; and determining an optimal darkfield image for each outer area of the plurality of darkfield images, the optimal darkfield image including the highest resolution for the respective outer area of the plurality of darkfield images.

20. The non-transitory computer-readable medium of claim 19, wherein the outer areas of the plurality of brightfield images are corner areas and the outer areas of the plurality of darkfield images are corner areas.

* * * * *